United States Patent
Liu

(10) Patent No.: US 8,076,980 B2
(45) Date of Patent: Dec. 13, 2011

(54) TEMPERATURE-COMPENSATED RING OSCILLATOR

(75) Inventor: Yi-Heng Liu, Taipei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 34 days.

(21) Appl. No.: 12/689,233

(22) Filed: Jan. 19, 2010

(65) Prior Publication Data

US 2011/0175684 A1    Jul. 21, 2011

(51) Int. Cl.
*H03K 3/03* (2006.01)
*H03B 5/04* (2006.01)

(52) U.S. Cl. .......................... 331/57; 331/176

(58) Field of Classification Search .............. 331/45, 331/57, 66, 176
See application file for complete search history.

(56) References Cited

U.S. PATENT DOCUMENTS

| | | | | |
|---|---|---|---|---|
| 4,549,818 A * | 10/1985 | Nishikubo et al. | ............ | 374/178 |
| 5,180,995 A * | 1/1993 | Hayashi et al. | ................ | 331/57 |
| 5,499,214 A * | 3/1996 | Mori et al. | .................... | 365/222 |
| 6,809,603 B1 * | 10/2004 | Ho | .................................. | 331/57 |
| 7,675,373 B2 * | 3/2010 | Thaller | ........................ | 331/57 |
| 7,777,555 B2 * | 8/2010 | Liao et al. | ..................... | 327/513 |

* cited by examiner

*Primary Examiner* — Levi Gannon
(74) *Attorney, Agent, or Firm* — Jianq Chyun IP Office

(57) ABSTRACT

A temperature-compensated ring oscillator includes a control signal generator and a voltage controlled oscillator. The control signal generator is configured to generate at least one control signal, and includes at least one first resistor and second resistor. A first temperature coefficient of the first resistor is negative, and a second temperature coefficient of the second resistor is positive. The voltage controlled oscillator receives the control signal, outputs an oscillation signal, and has (2k+1) cascaded inverter units, where $k \geq 1$. Each of the inverter units includes a first transistor, a second transistor and an inverter. The first transistor has a drain coupled to a first supply voltage and a gate to receive the control signal. The second transistor has a source to receive a second supply voltage and a gate to receive the control signal. The inverter is coupled between the first and the second transistors.

17 Claims, 2 Drawing Sheets

TEMPERATURE-COMPENSATED RING OSCILLATOR

BACKGROUND OF THE INVENTION

1. Field of the Invention

The invention relates to an oscillator, and more particularly, to a temperature-compensated ring oscillator.

2. Description of Related Art

An oscillator is used in electronic circuits to generate precise clock signals. However, an oscillation frequency of an oscillator is generally unstable. In particularly, the oscillation frequency varies with an ambient temperature, which affects the operation of backend circuits. Thus, it is desirable to reduce the influence of the change of an ambient temperature on the oscillator frequency.

SUMMARY OF THE INVENTION

The invention provides a temperature-compensated ring oscillator to compensate the change of the oscillation frequency in a ring oscillator circuit due to the change of an ambient temperature.

The invention provides a temperature-compensated ring oscillator which includes a control signal generator and a voltage controlled oscillator. The control signal generator is configured to generate at least one control signal. The control signal generator includes at least one first resistor and at least one second resistor. The first resistor has a first end which receives a reference voltage and a second end. The second resistor has a third end coupled to the second end of the first resistor, and the control signal is extracted from the third end of the second resistor. Besides, the first resistor and the second resistor respectively have a first temperature coefficient and a second temperature coefficient. The first temperature coefficient is negative, and the second temperature coefficient is positive. The voltage controlled oscillator receives the control signal, outputs an oscillation signal, and has (2k+1) cascaded inverter units, where $k \geq 1$. Each of the inverter units includes a first transistor, a second transistor and an inverter. The first transistor has a drain coupled to a first supply voltage and a gate to receive the control signal. The second transistor has a source to receive a second supply voltage and a gate to receive the control signal. The inverter is coupled between the first transistor and the second transistor. An output port of the $j^{th}$ inverter is connected to an input port of the $(j+1)^{th}$ inverter, where j is an integer from 1 to 2k. Furthermore, an output port of the $(2k+1)^{th}$ inverter is connected to an input port of the $1^{st}$ inverter.

In an embodiment of the invention, wherein the voltage controlled oscillator further includes at least one impedance unit coupled between two of the inverter units.

In an embodiment of the invention, the impedance unit includes a third transistor coupled between two of the inverter units, and the third transistor has a gate to receive the control signal.

In an embodiment of the invention, the temperature-compensated ring oscillator includes an active capacitor. The active capacitor has a fourth end coupled between adjacent two of the inverter units and a fifth end to receive the control signal.

In an embodiment of the invention, the active capacitor is a fourth transistor. The active capacitor has a gate coupled between two of the inverter units and has a drain and a source coupled together to receive the control signal.

In an embodiment of the invention, the inverter includes a P-channel transistor and an N-channel transistor. The P-channel transistor has a source coupled to the first transistor and has a drain. The N-channel transistor has a drain coupled to the drain of the P-channel transistor and has a source coupled to the second transistor. Besides, gates of the P-channel transistor and the N-channel transistor are coupled together.

In an embodiment of the invention, wherein an absolute value of the first temperature coefficient is smaller then an absolute value of the second temperature coefficient.

The invention provides another temperature-compensated ring oscillator which includes a control signal generator and a voltage controlled oscillator. The control signal generator is configured to generate at least one control signal, and includes at least one first resistor and at least one second resistor. The first resistor has a first end which receives a reference voltage and a second end. The second resistor has a third end coupled to the second end of the first resistor, and the control signal is extracted from the third end of the second resistor. The first resistor and the second resistor respectively have a first temperature coefficient and a second temperature coefficient. The first temperature coefficient is negative, and the second temperature coefficient is positive. The voltage controlled oscillator receives the control signal and outputs an oscillation signal. Besides, the voltage controlled oscillator has three inverter units. Each of the inverter units includes a first transistor, a second transistor and an inverter. The first transistor has a drain coupled to a first supply voltage and has a gate to receive the control signal. The second transistor has a source to receive a second supply voltage and has a gate to receive the control signal. The inverter is coupled between the first transistor and the second transistor. An output port of the $1^{st}$ inverter is connected to an input port of the $2^{nd}$ inverter. An output port of the $2^{nd}$ inverter is connected to an input port of the $3^{rd}$ inverter, and an output port of the $3^{rd}$ inverter is connected to an input port of the $1^{st}$ inverter.

The invention provides another temperature-compensated ring oscillator which comprises a control signal generator and a voltage controlled oscillator. The control signal generator is configured to generate 4 control signals, the control signal generator comprising 4 resistor modules, wherein the $x^{th}$ resistor module comprises a first resistor and a second resistor. The first resistor has a first end which receives a reference voltage and a second end, and the one second resistor has a third end coupled to the second end of the first resistor, wherein the $x^{th}$ control signal is extracted from the third end of the second resistor. The first resistor and the second resistor respectively have a first temperature coefficient and a second temperature coefficient. The first temperature coefficient is negative, and the second temperature coefficient is positive, and x is an integer from 1 to 4. The voltage controlled oscillator receives the control signals, outputs an oscillation signal, and has (2k+1) cascaded inverter units, where $k \geq 1$. Each of the inverter units comprises first transistor, a second transistor, an inverter, a third transistor, and a fourth transistor. The first transistor has a drain coupled to a first supply voltage and a gate to receive the $1^{st}$ control signal, and the second transistor has a source to receive a second supply voltage and a gate to receive the $2^{nd}$ control signal. The inverter is coupled between the first transistor and the second transistor. The third transistor has a gate to receive the $3^{rd}$ signal, and a source thereof is coupled to the output port of the inverter. The fourth transistor has a gate coupled to a drain of the third transistor, a source and a drain thereof are coupled to each other to receive the $4^{th}$ control signal. The gate of the fourth transistor in the $j^{th}$ inverter unit is connected to an input port of the $(j+1)^{th}$ inverter unit, where j is an integer from 1 to 2k, and the gate of the fourth transistor in the $(2k+1)^{th}$ inverter unit is connected to an input port of the $1^{st}$ inverter unit.

Based on the above, the temperature-compensated ring oscillator adjusts the voltage level of the control signal in response to an ambient temperature and compensates the change of an oscillation frequency of the oscillator. Therefore, the oscillation frequency is maintained stable against the change of the ambient temperature.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1:
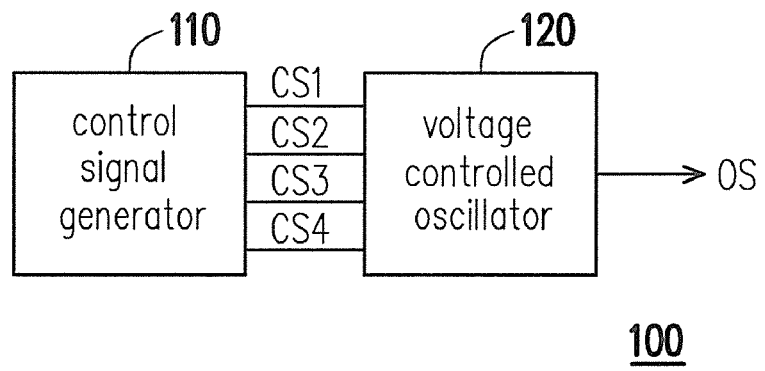
FIG. 1 is a block diagram of a temperature-compensated ring oscillator according to an embodiment of the invention.
Figure 2:
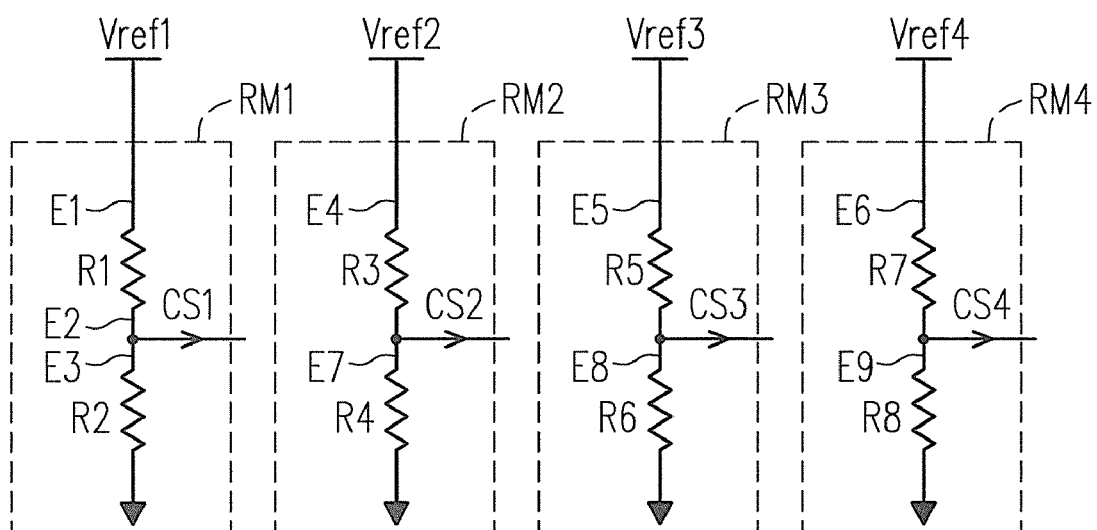
FIG. 2 is a circuit diagram of the control signal generator in FIG. 1.
Figure 3:
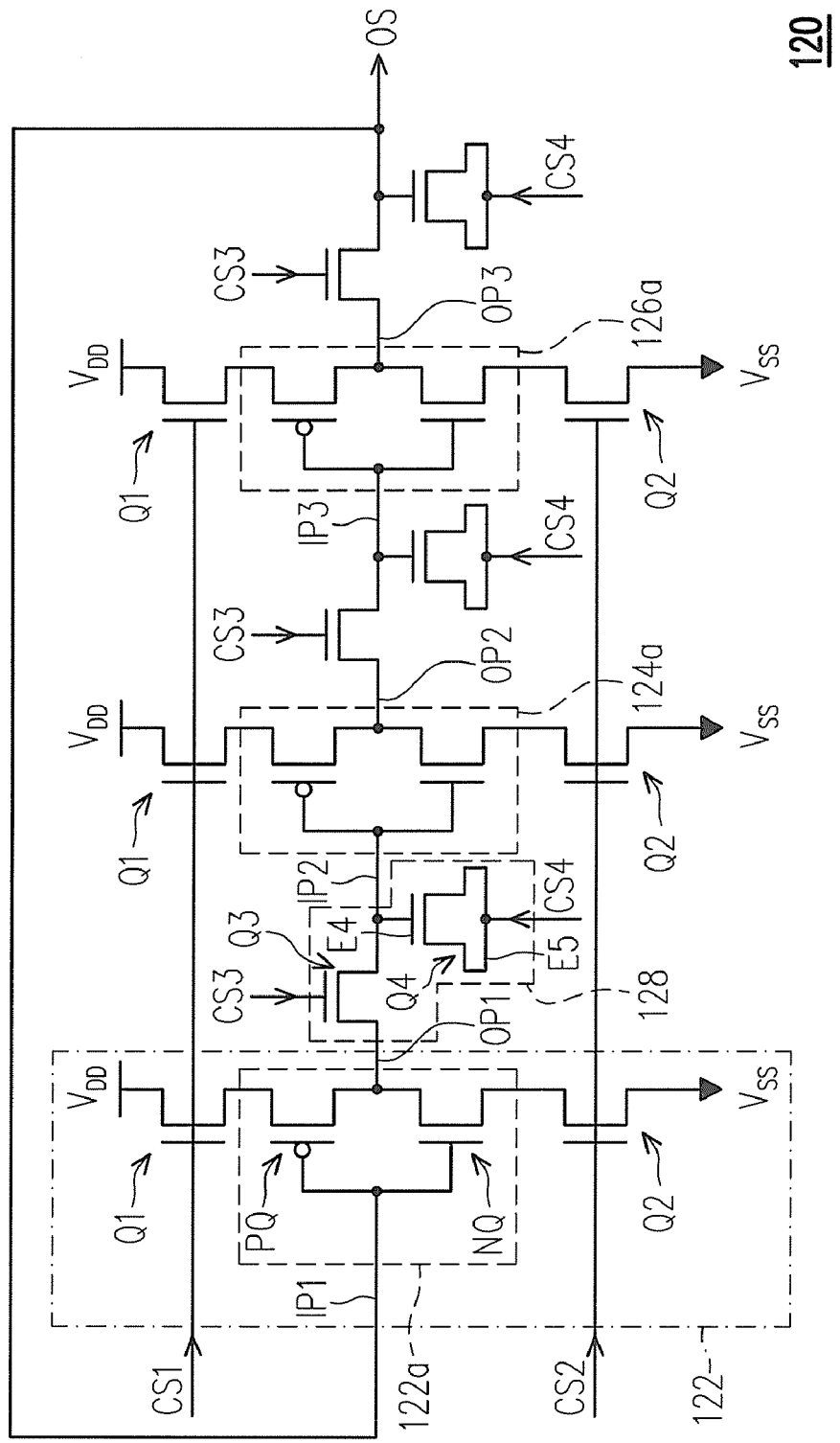
FIG. 3 is a circuit diagram of the voltage controlled oscillator in FIG. 1.

FIG. 1 is a block diagram of a temperature-compensated ring oscillator 100 according to an embodiment of the invention. Referring to FIG. 1, the temperature-compensated ring oscillator 100 includes a control signal generator 110 and a voltage controlled oscillator 120 coupled to the control signal generator 110. The control signal generator 110 is configured to generate at least one control signal, e.g. control signals CS1~CS4 as shown in FIG. 1. The control signals CS1~CS4 are substantially the same in the embodiment, but the invention is not limited thereto. The voltage controlled oscillator 120 receives the control signals CS1~CS4 and outputs an oscillation signal OS having an oscillation frequency. FIG. 2 is a circuit diagram of the control signal generator 110 in FIG. 1, and FIG. 3 is a circuit diagram of the voltage controlled oscillator 120 in FIG. 1. Referring to FIG. 2, the control signal generator 110 includes at least one resistor R1 and at least one resistor R2. In the embodiment, the signal generator includes four resistor modules RM1-RM4. The resistor module RM1 has the resistors R1 and R2 coupled to each other, the resistor module RM2 has resistors R3 and R4 coupled to each other, the resistor module RM3 has resistors R5 and R6 coupled to each other, and the resistor modules RM4 has resistors R7 and R8 coupled to each other. That is, eight resistors R1-R8 are respectively schematically shown in FIG. 2. However, the invention is not limited thereto.

As shown in FIG. 2, the resistor R1 has a first end E1 and a second end E2. The first end E1 of the resistors R1 receives a reference voltage Vref1. The resistor R2 has a third end E3 which is coupled to the second end E2 of the resistor R1. Moreover, a fourth end E4 of the resistor R3 receives a reference voltage Vref2, a fifth end E5 of the resistor R5 receives a reference voltage Vref3, and a sixth end E6 of the resistor R7 receives a reference voltage Vref4. Besides, the control signals CS1~CS4 is respectively extracted from the third end E3 of the resistor R2, a seventh end E7 of the resistor R4, an eighth end E8 of the resistor R6, and an ninth end of the resistor R9.

Furthermore, the resistors R1 and R2 respectively have a first temperature coefficient and a second temperature coefficient, wherein the first temperature coefficient is negative, and the second temperature coefficient is positive. That is the resistance of both the resistors R1 and R2 varies with an ambient temperature. And an absolute value of the first temperature coefficient is smaller then an absolute value of the second temperature coefficient. Hence, when the ambient temperature rises, the new ratio of R1 to R2 is less than before. On the other hand, when the ambient temperature falls, the new ratio of R1 to R2 is greater than before. For example, the first temperature coefficient of the resistor R1 may be a negative temperature coefficient, and the second temperature coefficient of the resistor R2 may be a positive temperature coefficient. Thus, as the ambient temperature rises, the resistance of the resistor R1 decreases but the resistance of the resistor R2 increases such that a cross voltage of the resistor R2 is greater than that of the resistor R1. On the other hand, as the ambient temperature falls, the resistance of the resistor R1 increases but the resistance of the resistor R2 decreases so that a cross voltage of the resistor R2 is less than that of the resistor R1. Accordingly, the voltage level of the each of control signals CS1~CS4 increases as the ambient temperature rises, and the voltage level of the each of control signals CS1~CS4 decreases as the ambient temperature falls. Furthermore, in another embodiment, the first temperature coefficient of the resistor R1 and the second temperature coefficient of the resistor R2 may be both positive, and the first temperature coefficient is smaller than the second temperature coefficient. Alternatively, the first temperature coefficient of the resistor R1 and the second temperature coefficient of the resistor R2 may be both negative, and the first temperature coefficient is smaller than the second temperature coefficient as well.

Referring to FIG. 3, the voltage controlled oscillator 120 receives the control signals CS1~CS4 and outputs the oscillation signal OS which has an oscillation frequency. As shown in FIG. 3, the voltage controlled oscillator 120 has three cascaded inverter units 122, but the invention is not limited thereto. Namely, the number of the inverter units 122 is (2k+1), where k≧1, and k equals to 1 in the embodiment. Each of the inverter units 122 includes a first transistor Q1, a second transistor Q2 and an inverter 122a, 124a or 126a. The first transistor Q1 has a drain coupled to a supply voltage $V_{DD}$ and a gate to receive the control signal CS1. The second transistor Q2 has a source to receive a supply voltage $V_{SS}$ and a gate to receive the control signal CS2. And the inverter 122a is coupled between the first transistor Q1 and the second transistor Q2.

When the voltage level of the control signal CS1 is greater then that of threshold voltage of the first transistor Q1, the first transistor Q1 is turned on such that the supply voltages $V_{DD}$ is able to be provided to the inverters 122a, 124a and 126a. Meanwhile, when the voltage level of the control signal CS2 is greater then that of threshold voltage of the second transistor Q2, the second transistor Q2 is turned on so that a current path is formed since the supply voltage $V_{DD}$ and $V_{SS}$ are respectively transmitted and provided to the inverters 122a, 124a and 126a. Besides, transmission time that the supply voltage $V_{DD}$ and $V_{SS}$ are transmitted to the inverters 122a 124a and 126a is related to the voltage levels of the control signals CS1 and CS2. In detail, the higher the voltage levels of the control signals CS1 and CS2 are, the less the transmission time is required. As a result, the inverters 122a, 124a and 126a are able to enter an operation mode quickly.

Referring to FIG. 3, an output port OP1 of the $1^{st}$ inverter 122a is connected to an input port IP2 of the $2^{nd}$ inverter 124a. An output port OP2 of the $2^{nd}$ inverter 124a is connected to an input port IP3 of the $3^{rd}$ inverter 126a. An output port OP3 of the $3^{rd}$ inverter 126a is connected to an input port IP1 of the $1^{st}$ inverter 122a. In addition, each of the inverters 122a-126a includes a P-channel transistor PQ and an N-channel transistor NQ. The P-channel transistor PQ has a source coupled to the first transistor Q1 and has a drain. The drain of P-channel transistor PQ is coupled to the output port OP1 of the 1$^{st}$ inverter 122a. Referring to FIG. 3, the N-channel transistor NQ has a drain coupled to the drain of the P-channel transistor PQ, and a source coupled to the second transistor Q2. And two gates of the P-channel transistor PQ and the N-channel transistor NQ are coupled together. Besides, the gates of the P-channel transistor PQ and the N-channel transistor NQ are coupled to the input port IP1 of the 1$^{st}$ inverter 122a as well, for example.

In operation, the oscillation frequency of the oscillator circuit tends to change depending on a change of the ambient temperature. More specifically, the oscillation frequency decreases as the ambient temperature rises, and the oscillation frequency increases as the ambient temperature decreases. Referring to both FIG. 2 and FIG. 3, in the embodiment, when the ambient temperature rises, the resistance of the resistor R1 decreases but the resistance of the resistor R2 increases such that a cross voltage of the resistor R2 is greater than that of the resistor R1. Then, the voltage level of each of the control signals CS1~CS4 is increased so that the transmission time in which the supply voltage $V_{DD}$ and $V_{SS}$ are transmitted to the inverter 122a, 124a and 126a is reduced. As a result, the oscillation frequency of the oscillation signal OS output by the voltage controlled oscillator 120 is compensated and the oscillation frequency is maintained stable against the rise in the ambient temperature.

On the other hand, when the ambient temperature falls, the resistance of the resistor R1 increases but the resistance of the resistor R2 decreases such that a cross voltage of the resistor R2 is less than that of the resistor R1. Then, the voltage level of each of the control signals CS1~CS4 is decreased so that the transmission time in which the supply voltage $V_{DD}$ and $V_{SS}$ are transmitted to the inverter 122a, 124a and 126a is increased. As a result, the oscillation frequency of the oscillation signal OS output by the voltage controlled oscillator 120 is compensated and the oscillation frequency is maintained stable against the drop in the ambient temperature.

Referring to FIG. 3, the voltage controlled oscillator 120 of the embodiment further includes at least one impedance unit, e.g. impedance units 128 (only three impedance units 128 are schematically shown in FIG. 3). Moreover, each of the impedance units 128 is coupled between two of the inverter units 122. In the embodiment, each of the impedance units 128 includes a third transistor Q3 coupled between two of the inverter units 128 and the third transistor Q3 has a gate to receive the control signal CS3. In the embodiment, the third transistor Q3 serves as an active resistor. When the ambient temperature rises, the voltage level of the control signal CS3 is increased due to the increment of the cross voltage of the resistor R2. Hence, a signal (not shown) output by the inverter units 122 is able to be transmitted in a higher speed, i.e. the resistance of the third transistor Q3 serving as an active resistor is decreased. As a result, the oscillation frequency provided by the voltage controlled oscillator 120 is compensated and the oscillation frequency is maintained stable against the rise in the ambient temperature.

On the other hand, when the ambient temperature falls, the voltage level of the control signal CS3 is decreased due to the decrement of the cross voltage of the resistor R2. Hence, a signal (not shown) from the inverter units 122 is transmitted in a lower speed, i.e. the resistance of the third transistor Q3 is increased. Therefore, the oscillation frequency provided by the voltage controlled oscillator 120 is compensated and the oscillation frequency is maintained stable against the drop in the ambient temperature.

Referring to FIG. 3, the impedance unit 128 further includes an active capacitor which is implemented by a fourth transistor Q4. The active capacitor has a fourth end E4, e.g. a gate of the fourth transistor Q4, coupled between two of the inverter units 122 and has a fifth end E5, e.g. a drain and a source of fourth transistor Q4, to receive the control signal CS4. As shown in FIG. 3, the drain and the source of the fourth transistor Q4 are coupled together. Since the voltage level of the control signal CS4 is increased as the ambient temperature rises, the voltage difference between the fourth end E4 and the fifth end E5 is decreased. Hence, the RC time constant of the third transistor Q3 (serving as an active resistor) and the fourth transistor Q4 (serving as the active capacitor) is decreased due to the decrement of the resistance of the third transistor Q3 and the capacitance of the fourth transistor Q4. As a result, the a signal (not shown) from the inverter units 122 is able to be transmitted in a higher speed such that the oscillation frequency provided by the voltage controlled oscillator 120 is compensated and the oscillation frequency is maintained stable against the rise in the ambient temperature.

Similarly, since the voltage level of the control signal CS4 is decreased as the ambient temperature falls, the voltage difference between the fourth end E4 and the fifth end E5 is increased. Hence, the RC time constant of the third transistor Q3 (serving as an active resistor) and the fourth transistor Q4 (serving as an active capacitor) is increased due to the increment of the resistance of the third transistor Q3 and the capacitance of the fourth transistor Q4. As a result, the a signal (not shown) from the inverter units 122 is transmitted in a lower speed such that the oscillation frequency provided by the voltage controlled oscillator 120 is compensated and the oscillation frequency is maintained stable against the drop in the ambient temperature.

In light of the foregoing, the temperature-compensated ring oscillator of the embodiment utilizes two resistors having different temperature coefficients and together with an active resistor and capacitor such that a stable oscillation frequency against the change of the ambient temperature is provided. Besides, the temperature-compensated ring oscillator of the embodiment is able to function independently from a system power and operate under a high voltage. Furthermore, since a threshold voltage of the transistor is subtracted from the supply voltage, the number of the hot carriers is reduced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A temperature-compensated ring oscillator, comprising:
a control signal generator configured to generate at least one control signal, the control signal generator comprising:
at least one first resistor having a first end which receives a reference voltage and a second end; and
at least one second resistor having a third end coupled to the second end of the first resistor, wherein the control signal is extracted from the third end of the second resistor, the first resistor and the second resistor respectively having a first temperature coefficient and a second temperature coefficient, wherein the first temperature coefficient is negative, and the second temperature coefficient is positive; and a voltage controlled oscillator receiving the control signal from the third end of the second resistor and outputting an oscillation signal, the voltage controlled oscillator having (2k+1) cascaded inverter units, where k≧1, each of the inverter units comprising:

a first transistor having a drain coupled to a first supply voltage and a gate to receive the control signal;

a second transistor having a source to receive a second supply voltage and a gate to receive the control signal; and an inverter coupled between the first transistor and the second transistor, wherein an output port of the $j^{th}$ inverter is connected to an input port of the $(j+1)^{th}$ inverter, where j is an integer from 1 to 2k, and an output port of the $(2k+1)^{th}$ inverter is connected to an input port of the $1^{st}$ inverter.

2. The temperature-compensated ring oscillator of claim 1, wherein the voltage controlled oscillator further comprises at least one impedance unit coupled between adjacent two of the inverter units.

3. The temperature-compensated ring oscillator of claim 2, wherein the impedance unit comprises a third transistor coupled between two of the inverter units and the third transistor has a gate to receive the control signal.

4. The temperature-compensated ring oscillator of claim 2, wherein the impedance unit comprises an active capacitor, and the active capacitor has a fourth end coupled between two of the inverter units and a fifth end to receive the control signal.

5. The temperature-compensated ring oscillator of claim 4, wherein the active capacitor is a fourth transistor having a gate coupled between two of the inverter units and having a drain and a source coupled together to receive the control signal.

6. The temperature-compensated ring oscillator of claim 1, wherein the inverter comprises:

a P-channel transistor having a source coupled to the first transistor and having a drain; and an N-channel transistor having a drain coupled to the drain of the P-channel transistor and a source coupled to the second transistor, wherein gates of the P-channel transistor and the N-channel transistor are coupled together.

7. The temperature-compensated ring oscillator of claim 1, wherein an absolute value of the first temperature coefficient is smaller than an absolute value of the second temperature coefficient.

8. A temperature-compensated ring oscillator, comprising:

a control signal generator configured to generate at least one control signal, the control signal generator comprising:

at least one first resistor having a first end which receives a reference voltage and a second end; and at least one second resistor having a third end coupled to the second end of the first resistor, wherein the control signal is extracted from the third end of the second resistor, the first resistor and the second resistor respectively having a first temperature coefficient and a second temperature coefficient, wherein the first temperature coefficient is negative, and the second temperature coefficient is positive; and a voltage controlled oscillator receiving the control signal from the third end of the second resistor and outputting an oscillation signal, the voltage controlled oscillator having three inverter units, each of the inverter units comprising:

a first transistor having a drain coupled to a first supply voltage and a gate to receive the control signal;

a second transistor having a source to receive a second supply voltage and a gate to receive the control signal; and an inverter coupled between the first transistor and the second transistor, wherein an output port of the $1^{st}$ inverter is connected to an input port of the $2^{nd}$ inverter, an output port of the $2^{nd}$ inverter is connected to an input port of the $3^{rd}$ inverter, and an output port of the $3^{rd}$ inverter is connected to an input port of the $1^{st}$ inverter.

9. The temperature-compensated ring oscillator of claim 8, wherein the voltage controlled oscillator further comprises three impedance units, each of the impedance units coupled between adjacent two of the inverter units.

10. The temperature-compensated ring oscillator of claim 9, wherein each of the impedance units comprises a third transistor coupled between two of the inverter units and the third transistor has a gate to receive the control signal.

11. The temperature-compensated ring oscillator of claim 9, wherein each of the impedance units comprises an active capacitor, and the active capacitor has a fourth end coupled between two of the inverter units and a fifth end to receive the control signal.

12. The temperature-compensated ring oscillator of claim 11, wherein the active capacitor is a fourth transistor having a gate coupled between two of the inverter units and having a drain and a source coupled together to receive the control signal.

13. The temperature-compensated ring oscillator of claim 8, wherein the inverter comprises:

a P-channel transistor having a source coupled to the first transistor and having a drain; and an N-channel transistor having a drain coupled to the drain of the P-channel transistor and a source coupled to the second transistor, wherein gates of the P-channel transistor and the N-channel transistor are coupled together.

14. The temperature-compensated ring oscillator of claim 8, wherein an absolute value of the first temperature coefficient is smaller than an absolute value of the second temperature coefficient.

15. A temperature-compensated ring oscillator, comprising:

a control signal generator configured to generate 4 control signals, the control signal generator comprising 4 resistor modules, wherein the $x^{th}$ resistor module comprises:

a first resistor having a first end which receives a reference voltage and a second end; and a second resistor having a third end coupled to the second end of the first resistor, wherein the $x^{th}$ control signal is extracted from the third end of the second resistor, the first resistor and the second resistor respectively having a first temperature coefficient and a second temperature coefficient, wherein the first temperature coefficient is negative, and the second temperature coefficient is positive, and x is an integer from 1 to 4; and a voltage controlled oscillator receiving the control signal and outputting an oscillation signal, the voltage controlled oscillator having (2k+1) cascaded inverter units, where k≧1, each of the inverter units comprising:

a first transistor having a drain coupled to a first supply voltage and a gate to receive the $1^{st}$ control signal;

a second transistor having a source to receive a second supply voltage and a gate to receive the $2^{nd}$ control signal;

an inverter coupled between the first transistor and the second transistor;

a third transistor having a gate to receive the $3^{rd}$ signal, and a source coupled to the output port of the inverter; and a fourth transistor having a gate coupled to a drain of the third transistor, a source and a drain coupled to each other to receive the $4^{th}$ control signal, wherein the gate of the fourth transistor in the $j^{th}$ inverter unit is connected to an input port of the $(j+1)^{th}$ inverter unit, where j is an integer from 1 to 2k, and the gate of the fourth transistor in the $(2k+1)^{th}$ inverter unit is connected to an input port of the $1^{st}$ inverter unit.

16. The temperature-compensated ring oscillator of claim 15, wherein an absolute value of the first temperature coefficient is smaller than an absolute value of the second temperature coefficient.

17. A temperature-compensated ring oscillator, comprising:

a control signal generator configured to generate at least one control signal, the control signal generator comprising:

at least one first resistor having a first end which receives a reference voltage and a second end; and at least one second resistor having a third end coupled to the second end of the first resistor, wherein the control signal is extracted from the third end of the second resistor, the first resistor and the second resistor respectively having a first temperature coefficient and a second temperature coefficient, wherein an absolute value of the first temperature coefficient is smaller than an absolute value of the second temperature coefficient; and a voltage controlled oscillator receiving the control signal and outputting an oscillation signal, the voltage controlled oscillator having (2k+1) cascaded inverter units, where $k \geqq 1$, each of the inverter units comprising:

a first transistor having a drain coupled to a first supply voltage and a gate to receive the control signal;

a second transistor having a source to receive a second supply voltage and a gate to receive the control signal; and an inverter coupled between the first transistor and the second transistor, wherein an output port of the $j^{th}$ inverter is connected to an input port of the $(j+1)^{th}$ inverter, where j is an integer from 1 to 2k, and an output port of the $(2k+1)^{th}$ inverter is connected to an input port of the $1^{st}$ inverter.

* * * * *